(12) United States Patent
Sawyer et al.

(10) Patent No.: US 8,452,461 B2
(45) Date of Patent: May 28, 2013

(54) CONTROL SYSTEM FOR PHOTOVOLTAIC POWER PLANT

(75) Inventors: Harry Sawyer, Dripping Springs, TX (US); Simon Chee, Toledo, OH (US); Todd Walter, Scottsdale, AZ (US); Todd Kline, Whitehouse, OH (US); John Bellacicco, Stamford, CT (US)

(73) Assignee: First Solar, Inc, Perrysburg, OH (US)

( * ) Notice: Subject to any disclaimer, the term of this patent is extended or adjusted under 35 U.S.C. 154(b) by 44 days.

(21) Appl. No.: 13/104,471

(22) Filed: May 10, 2011

(65) Prior Publication Data

US 2011/0264289 A1 Oct. 27, 2011

(51) Int. Cl.
  *G06F 1/26* (2006.01)
  *H02J 3/14* (2006.01)

(52) U.S. Cl.
  USPC ............................................. 700/291; 307/31

(58) Field of Classification Search
  USPC ................ 700/287, 291, 292; 307/31, 43, 66, 307/77–82
  See application file for complete search history.

(56) References Cited

U.S. PATENT DOCUMENTS

| | | | |
|---|---|---|---|
| 6,111,767 A | 8/2000 | Handleman | |
| 7,772,716 B2* | 8/2010 | Shaver et al. | 307/31 |
| 7,913,181 B2* | 3/2011 | Kumar et al. | 715/772 |
| 7,928,598 B2* | 4/2011 | King et al. | 307/9.1 |
| 8,035,249 B2* | 10/2011 | Shaver et al. | 307/31 |
| 2010/0001587 A1* | 1/2010 | Casey et al. | 307/80 |
| 2010/0138063 A1* | 6/2010 | Cardinal et al. | 700/291 |
| 2010/0145533 A1* | 6/2010 | Cardinal et al. | 700/291 |
| 2010/0250018 A1 | 9/2010 | Hauf et al. | |
| 2010/0295377 A1* | 11/2010 | Sok et al. | 307/82 |
| 2011/0241433 A1* | 10/2011 | Sihler et al. | 307/82 |
| 2011/0295535 A1* | 12/2011 | Lewis et al. | 702/64 |

FOREIGN PATENT DOCUMENTS

WO WO 2008/124144 A1 10/2008

* cited by examiner

*Primary Examiner* — Dave Robertson
(74) *Attorney, Agent, or Firm* — Dickstein Shapiro LLP

(57) ABSTRACT

A control system for a photovoltaic ("PV") power plant that includes a plant-level control system for implementing plant-level control functions at power generation sites of the plant, a supervisory system for supervisory control and data acquisition of the plant, and a communications network connecting the plant-level control system, the supervisory system, and plant devices is described. Methods of controlling a PV plant using the plant-level control system and the supervisory system and methods of regulating power characteristics in power generation sites are also described.

13 Claims, 5 Drawing Sheets

US 8,452,461 B2

CONTROL SYSTEM FOR PHOTOVOLTAIC POWER PLANT

TECHNICAL FIELD

The subject matter described herein relates to control systems for solar power plants, such as photovoltaic ("PV") power plants.

BACKGROUND

Solar power plants, typically include multiple power generation sites, each of which may include one or more solar power generation devices. The electrical power generated at the multiple power generation sites is typically transmitted to a desired location or to a power grid at one or more locations.

A power generation site for a photovoltaic ("PV") solar power plant may include a power conversion station having multiple PV solar panels connected to an inverter. The PV panels generate electrical power as direct current ("DC") electricity. The inverter receives electricity generated by the PV solar panels as DC electricity. The DC electricity generated by the PV solar panels may be amplified or otherwise modified before it is transmitted to the inverter. The inverter then converts the DC electricity to alternating current ("AC") electricity, and transmits the AC electricity to a point of common connection (commonly referred to as a "point of intersection" or "POI") with other power generation sites in the electrical generating system.

A PV power plant typically includes numerous plant devices, such as PV panels, electrical combiner boxes, electrical inverters, trackers used to adjust PV panels, sensors, and other devices that are used in the generation of solar power. One important aspect of PV power plant is how plant devices are controlled and monitored. Conventional control system architectures for electrical generating systems typically either embed control and data aggregation functions into individual power generation devices (such as inverters), or provide this function through the use of other power electronics at the plant site, such as in the D-VAR intelligent grid systems manufactured by American Superconductor. Conventional control system architectures monitor the AC power that is provided from each power generation site, but typically do not monitor the DC power prior to its conversion to AC power.

It is desirable to have a control system for a solar power plant that provides plant-level control functions (such as control of plant devices), data acquisition functions, and interconnections between the various elements and facilities of the electrical generating system from a centralized location, which is cost effective, of relatively simple design, and scalable. It is also desirable to monitor and regulate the amount of DC power that is generated by a collection of PV panels prior to its conversion to AC power.

Embodiments described herein include various control systems for PV power plants, with a centralized control of various aspects of the electrical generating systems.

DETAILED DESCRIPTION

In the following detailed description, reference is made to the accompanying drawings which foam a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein without departing from the spirit or scope of the invention.

This disclosure describes various control systems for photovoltaic ("PV") electrical generating systems. Described control systems provide a flexible platform for functions including real time power control for plant devices at multiple power generation sites, supervisory control functions for plant operation and for non-time-critical control capability, and data acquisition functions for monitoring plant performance and for supporting operations and maintenance. The described control systems separate plant-level control functions, supervisory control functions, and/or data aggregation functions into their own separate physical and logical entities.

Described embodiments of control systems for PV power plants include a plant-level control system and a plant supervisory system, among other elements. Described embodiments include control hardware and software, data acquisition hardware and software, networking elements, interfaces for users, interfaces for other instruments such as sensors, or other devices such as a remote terminal unit, and interfaces to other systems. Described embodiments also include remote access and access security functions.

Figure 1:
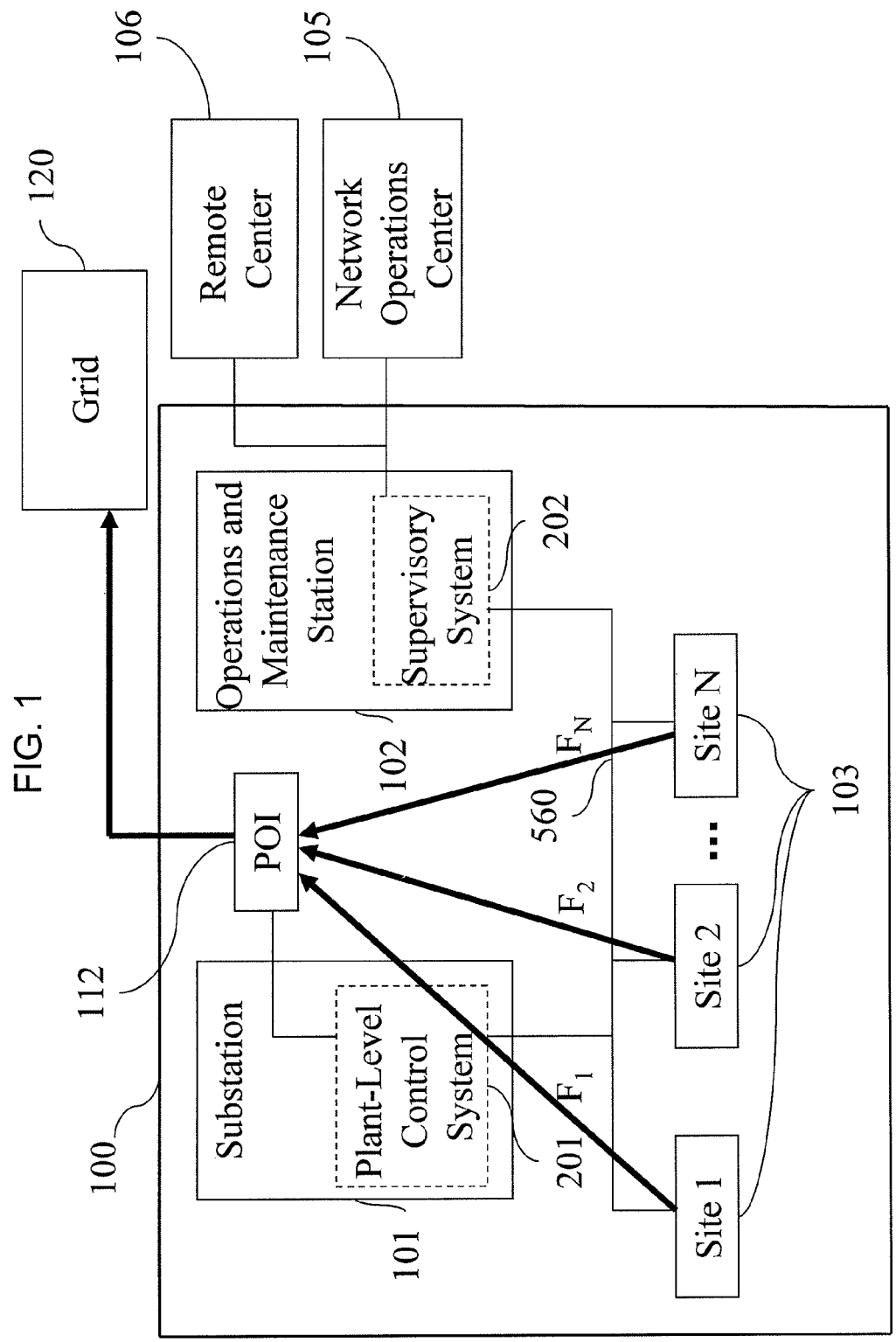
FIG. 1 is a block diagram of an electrical generating system in accordance with embodiments described herein.

FIG. 1 shows a block diagram of a PV power plant 100. Plant 100 includes at least one substation 101, an operations and maintenance station 102, and one or more power generation sites 103. Although only a single substation 101 is shown in FIG. 1, it should be understood that plant 100 may include multiple substations 101, each being having multiple associated power generation sites 103.

Each power generation site 103 in plant 100 will typically include multiple plant devices (described further below with regard to FIG. 2). Such plant devices may include PV panels used to generate and transfer electricity, electrical combiner boxes for interconnecting the outputs of a plurality of PV panels, inverters for inverting DC electrical signals to AC electrical signals, trackers or other mounting mechanisms for controlling the configuration of the PV panels, sensors for detecting various conditions, as well as other equipment and components used in the generation, operation, and/or control of solar power. For example, in a PV power plant, each power generation site 103 may include multiple PV panels that generate DC electricity from solar radiation, solar trackers associated with mounted PV panels which direct the PV panels to face incident light, combiner boxes to combine the DC electricity received from multiple PV panels, and inverters to convert DC electricity (for example, received from one or more combiner boxes) to AC electricity for further transmission.

Plant 100 includes a point of common power connection among the power generation sites 103, referred to as a point of intersection ("POI") 112. Electrical power generated at the one or more power generation sites 103 is output as AC power onto an electrical power grid 120 (or to another desired location) through POI 112. Accordingly, POI 112 represents a single output for plant 100, and the power characteristics measured at POI 112 are the characteristics of the electrical power that is input to grid 120.

Substation 101, operations and maintenance station 102, and power generation sites 103 of plant 100 are interconnected by a plant communications network 560. Communications network 560 may be a fiber-optic, wired or wireless network, or other suitable type of network for providing communications among various control system components in plant 100. For example, communications network 560 may be a redundant high speed ring optical fiber local-area network ("LAN") with private network addressing. Preferably, communications network 560 includes standardized switches with virtual LAN ("VLAN") support, including support for access by systems of third party service providers. VLAN refers to a LAN network where a group of hosts (typically with a common set of requirements) communicate as if they are attached to the same LAN regardless of their physical location.

A network operations center 105 and remote center 106 (for example, an offsite customer control center) may be remotely connected to plant 100. Network operations center 105 and/or remote center 106 may be connected to a supervisory system 202 of plant 100 using conventional secure internet connections, as described further below.

As shown in FIG. 1, plant 100 also includes a plant-level control system 201 for providing real time plant-level control functions, such as active power control, voltage regulation, and power factor set point capability, among other control functions. Elements of plant-level control system 201 may be located in substation 101, as shown in FIG. 1. Alternatively, some or all elements of plant-level control system 201 may be located outside of substation 101, and may be in several different locations (such as other substations) in plant 100. If plant 100 includes a plurality of substations 101, plant-level control system 201 may be located in one of the plurality of substations 101, and connected to other substations 101 and power generation sites 103 through communications network 560.

A supervisory system 202 for providing supervisory control and data acquisition functions, including control and data acquisition capability for plant devices at each power generation site 103, is provided in operations and maintenance station 102. Elements of supervisory system 202 may be located in operations and maintenance station 102, as shown in FIG. 1. Alternatively, some or all elements of supervisory system 202 may be located outside of operations and maintenance station 102, and may be in several different locations (such as in substation 101, network operations center 105, or remote center 106).

Plant-level control system 201 and a supervisory system 202 form an overall control system for plant 100. The control system for plant 100 is described further below.

Figure 2:
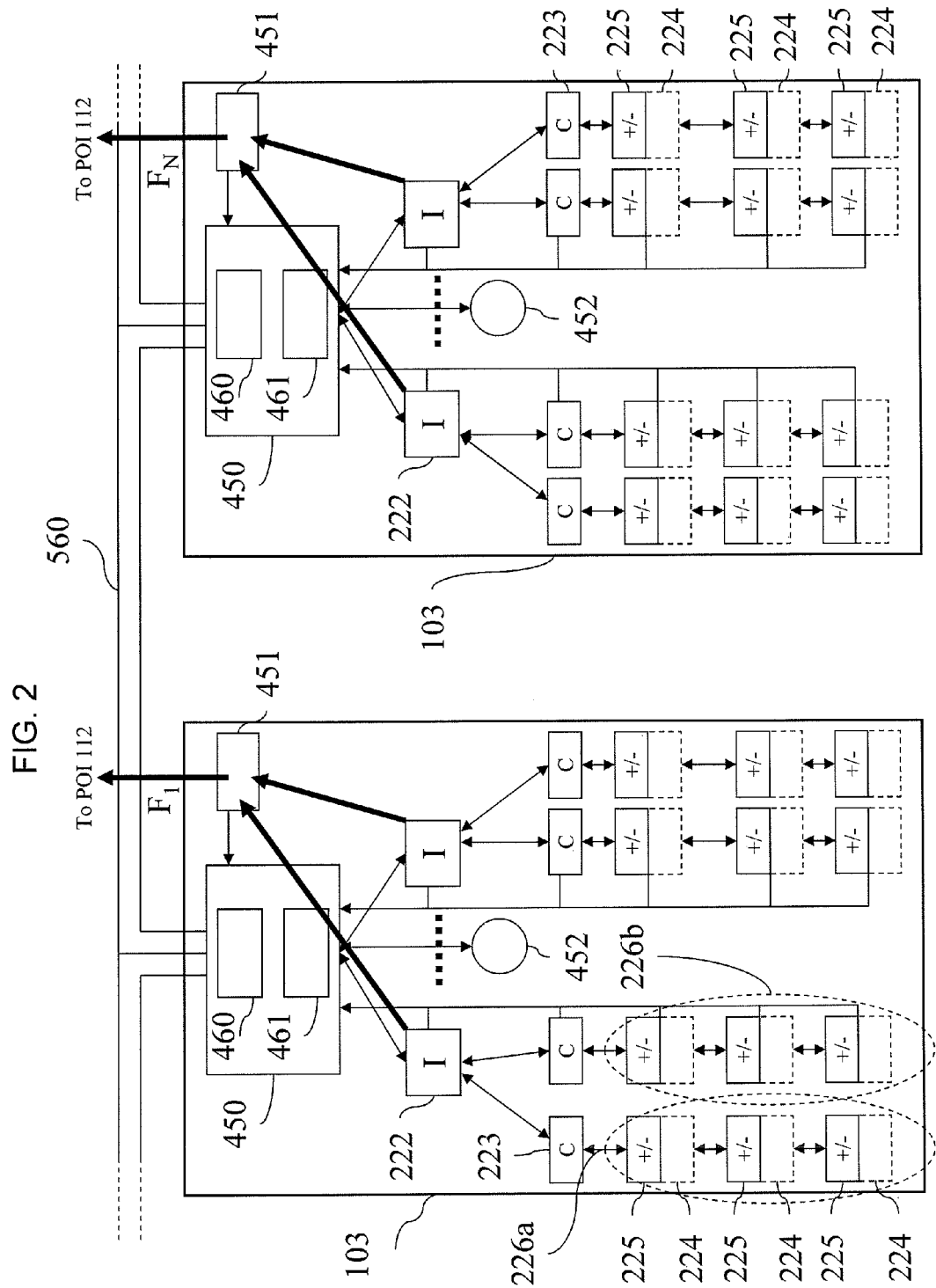
FIG. 2 is a block diagram of power generation sites of an electrical generating system in accordance with embodiments described herein.

FIG. 2 is a block diagram showing greater detail of plant devices within power generation sites 103. It should be understood that the plant devices shown in FIG. 2 are only exemplary plant devices, and power generation sites 103 may include other plant devices known in the art.

Each power generation site 103 shown in FIG. 2 includes multiple PV panels 225 that serve as power generators. PV panels 225 generate direct-current ("DC") electricity from solar radiation. Multiple PV panels may be interconnected in series or parallel strings, with each power generation site including one or more strings 226 of PV panels. In FIG. 2, a first string 226a and a second string 226b of PV panels 225 are labeled for clarity, although it should be understood that other strings 226 of PV panels 225 are shown as well. The DC output from multiple PV panels 225 (such as from the PV panels 225 in one or more strings 226) is combined at a combiner box 223. The DC output from one or more combiner boxes 223 is then input into an inverter 222 that inverts the DC electricity into alternating-current ("AC") electricity. Accordingly, power generation site 103 includes a DC region that includes plant devices and interconnections (e.g., PV panels 225, combiner boxes 223, and the input to inverters 222) along a power chain prior to inverter 222, and an AC region that includes plant devices and interconnections (e.g., the output of inverters 222 and power generation site output 451) along the power chain after inverter 222.

Each PV panel 225 is also coupled to a mounting mechanism 224, which may include a tracker that orients one or more PV panels 225 according to present local conditions (e.g., according to the present local environmental conditions and/or the direction of incident sunlight).

Each inverter 222 in a power generation site 103 outputs the AC electric power to point of intersection ("POI") 112 of plant 100 (FIG. 1) through the power generation site output 451.

Each power generation site 103 also includes a monitoring and communication device 450 that includes a storage element 460 (such as a direct-attached storage) and a logic element 461 (such as a programmable logic controller). Monitoring and communication device 450 provides translation of commands (such as commands for plant-level control functions, described further below) that are received over a communications network 560 if the commands are in a different protocol or format than those supported by the plant devices of the power generation site 103.

In addition, monitoring and communication device 450 interfaces with and collects data from integrated monitoring systems of plant devices within power generation site 103. Monitoring and communication device 450 collects DC power characteristics (e.g., current, voltage, and/or other measurements) of plant devices (such as PV panels 225 and combiner boxes 223) and interconnections within the DC region of power generation sites 103, and collects AC power characteristics (e.g., current, voltage, and/or other measurements) of plant devices (such as inverters 222) and interconnections within the AC region. Monitoring and communication device 450 also collects data regarding the overall AC output of the power generation site at output 451. This data can be stored in the storage element 460 of communication device 450 and provided to plant-level control system 201 and/or supervisory system 202 (FIG. 5) through communications network 560.

The capability at power generation site 103 to monitor DC power characteristics provides for curtailment of DC power that is input into each inverter 222. For example, as discussed further below with regard to FIGS. 3 and 4, plant control functions performed by plant-level control system 201 may require a certain level of AC power to be output from each power generation site 103. Typically, the AC power that is output from each power generation site 103 is regulated by adjusting the output of power in the AC region (e.g., adjusting the AC power output of the inverter 222). Also, each inverter 222 may have a threshold level for one or more input DC power characteristics, such as a maximum amount of input DC current that the inverter 222 can invert to output AC current. If the input DC current to inverter 222 exceeds this threshold, generated DC power may be wasted, and the inverter 222 may be damaged.

By measuring power characteristics in the DC region of power generation site 103 through monitoring and communication device 450, the DC power that is input to each inverter 222 can be regulated in the DC region. For example, the amount of overall power generated from a first group of PV panels 225 (e.g., a first string 226a of PV panels 225) that are associated with a first combiner box 223, and the amount of overall power drawn from a second group of PV panels 225 (e.g., a second string 226b of PV panels 225) that are associated with a second combiner box 223 can be regulated through controlled relays, switches, or other controlled devices. Regulating the overall power drawn by different groups of PV panels 225 associated with respective combiner boxes 223 can regulate the total DC power load that is input to each respective inverter 222.

In addition, regulating the overall power drawn by different groups of PV panels 225 associated with respective combiner boxes allows for balancing the power produced by the two groups of PV panels 225 during optimal conditions at both groups of panels, and to increase one group in response to the other group's decrease in power generation, for example due to less than optimal conditions at the other group's PV panels 225.

Each combiner box 223 may be configured to regulate the DC power generated by the group of PV panels 225 associated therewith. For example, in response to measurements in the DC region, a controlled relay, switch, or other controlled device in a combiner box 223 can be triggered to stop receiving DC current from one or more associated PV panels 225. This can regulate the amount DC current that is being input into inverter 222 by each associated combiner box 223, which in turn impacts the amount of AC power that is output by inverter 222.

Figure 5:
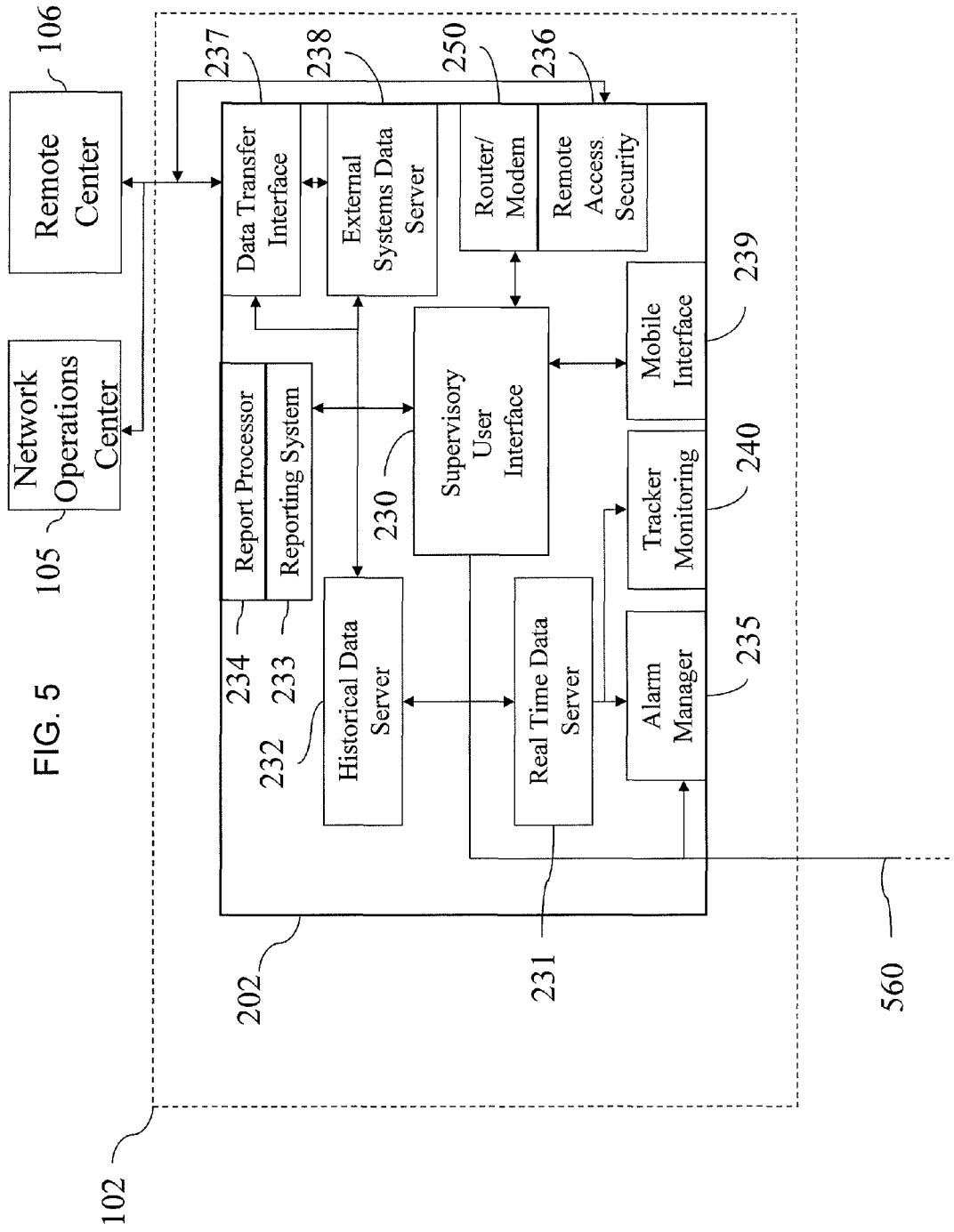
FIG. 5 is a block diagram of a supervisory control system in accordance with embodiments described herein.

Power generation site 103 also includes one or more sensors 452 for monitoring environmental conditions or conditions at PV panels 225. For example, sensors 452 may be configured to monitor horizontal irradiance, plane of array irradiance, wind speed, wind direction, outside air temperature, outside relative humidity, daily and annual rainfall, panel temperature, and/or other conditions related to the PV panels 225. Sensors 452 are also connected to monitoring and communication device 450 in order to provide data collected by sensors 452 to supervisory system 202 (FIG. 5).

As described further below with regard to FIGS. 3-5, plant-level control system 201 and supervisory system 202 form a control system for plant 100 (FIG. 1) that includes separate physical or logical entities for control and data aggregation functions. The control system provides advantages over conventional systems, including providing for control of power characteristics of the plant's output at POI 112 through the broadcast of uniform control functions to different plant devices, as well as through control of the plant devices (e.g., PV panels 225, electrical combiner boxes 223, inverters 222, mounting mechanisms 224, sensors 452, etc.) on an individual basis. In addition, plant-level control functions are governed by a master controller 213 (FIG. 3) that can be configured locally by users of plant-level control system 201, or by users of supervisory system 202, as described further below.

Figure 3:
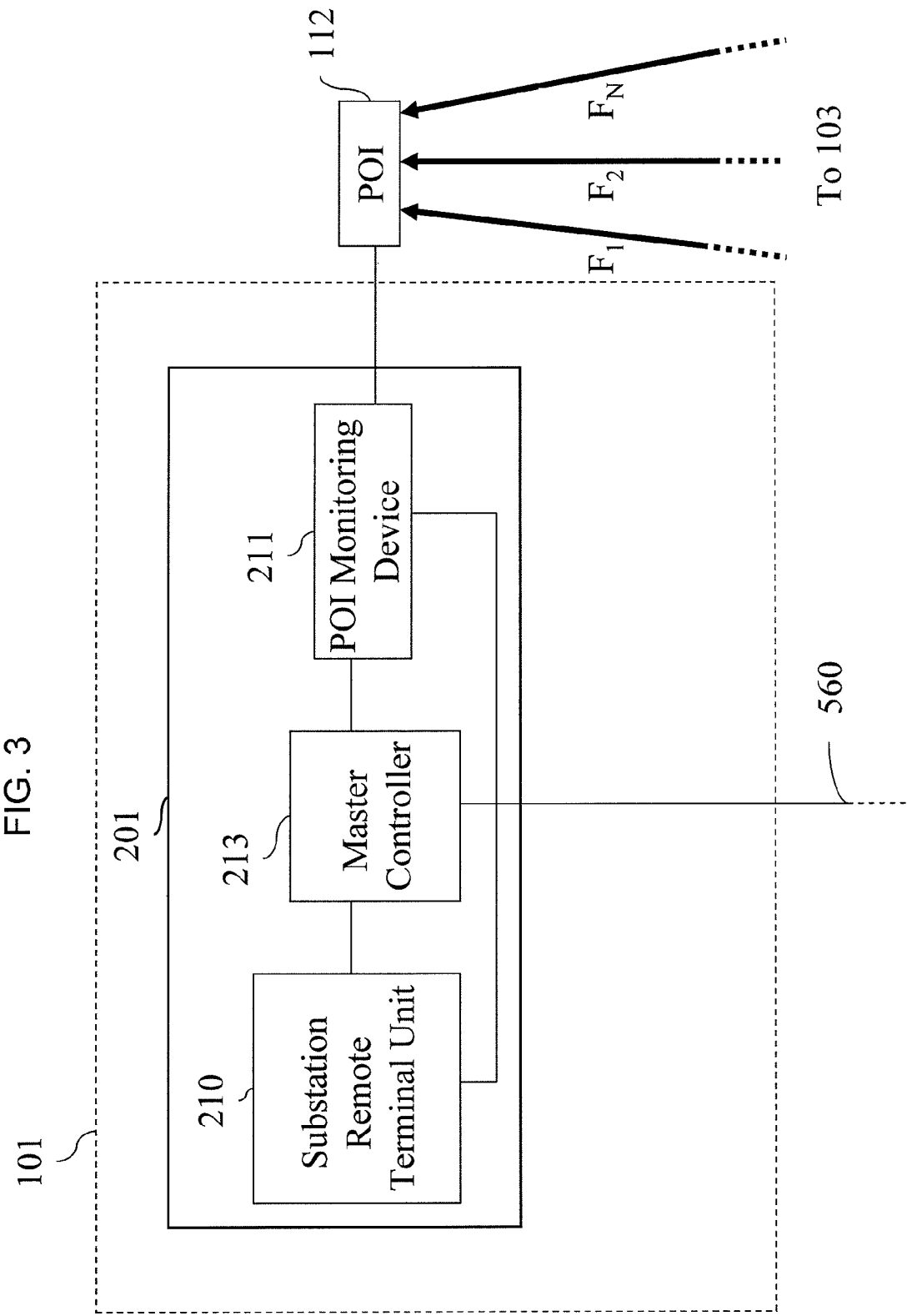
FIG. 3 is a block diagram of a plant-level control system in accordance with embodiments described herein.

FIG. 3 shows a block diagram of plant-level control system 201, which is shown as contained within a substation 101. As discussed above, elements of plant-level control system 201 can be implemented within substation 101 of plant 100 (FIG. 1), or separately from substation 101. Plant-level control system 201 includes hardware and software sufficient to enable fully automatic and independent operation of plant 100, as described further below.

Plant-level control system 201 includes one or more substation remote terminal units ("RTU") 210. Substation remote terminal unit 210 may be a microprocessor-controlled device that is configured to act as a local control hub for the plant-level control system, and that is interfaced to other elements of plant-level control system 201 using standard substation equipment interface protocols, such as DNP3 or IEC6185, or other interface protocols known in the art. Substation RTU 210 also includes a web-based user interface (e.g., with a display, keyboard, etc.) for local operation, configuration, and troubleshooting of plant 100. Substation RTU 210 provides flexibility for grid operators and others to locally provide commands (e.g., instructions and/or parameters for plant control functions, described further below) to master controller 213 (described below).

Plant-level control system 201 also includes a master controller 213. Master controller 213 may include one or more logic engines including at least one processor. Master controller 213 may be a separate element, or may be built into substation RTU 210. Master controller 213 provides instructions for real time plant-level control functions to plant devices in power generation sites 103 (FIG. 2) across communications network 560. Master controller 213 may be configured through substation RTU 210, or through a supervisory user interface 230 (FIG. 5) of supervisory system 202 (described further below) over communications network 560 or another secure connection.

Plant-level control system 201 also includes a POI monitoring device 211, which may be interfaced with master controller 213 and/or to substation RTU 210 via known protocols, such as DNP3 or IEC61850, or other protocols known in the art. POI monitoring device 211 includes sensors and other elements configured to detect various power characteristics, such as voltage level, reactive voltage, power level, and other power characteristics known in the art, at POI 112.

Plant-level control system 201 is designed to regulate the real and reactive power output of plant 100 as a single large generator. As described above with regard to FIGS. 1 and 2, plant 100 includes one or more PV panels 225 (FIG. 2) in each of multiple power generation sites 103. Each PV panel 225 generates DC electrical power based on its present capability (for example, based on the current local environmental conditions at the PV panel 225). Plant-level control system 201 coordinates plant-level control functions for plant devices in each power generation site 103 in order to regulate the overall output of plant 100, for example by regulating power characteristics in the DC region of each power generation site 103 (e.g., regulating the output of strings 226 of PV panels 225 or combiner boxes 223), by regulating power characteristics in the AC region of each power generation site 103 (e.g., regulating the output of inverters 222 or power generation site outputs 451), or both. By coordinating the plant-level control functions, plant-level control system 201 provides typical large power plant features—such as active power control, voltage regulation, and/or volt-ampere reactive ("VAR") regulation, described further below—to plant 100. Master controller 213 is capable of providing plant-level control functions for all of plant 100.

Plant-level control system 201 is also interfaced with supervisory system 202 (described further below), for example, through a supervisory user interface 230 (FIG. 5), through communications network 560 or through another secure connection to substation RTU 210 or master controller 213. Interfacing plant-level control system 201 with supervisory system 202 allows plant-level control system 201 to provide data (e.g., as alarm signals, status information, metering, operating modes information, and monitoring information to supervisory system 202) to supervisory system 202, and to accept commands for plant-level control functions from supervisory system 202. To ensure reliable supervisory control capability, master controller 213 includes an internal clock or receives an external clock that is synchronized to a clock of the supervisory user interface 230 (FIG. 5), preferably with ±0.1 second.

Commands for plant control functions are provided to master controller 213 from supervisory system 202 through supervisory user interface 230 (FIG. 5), from substation RTU 210, or automatically through other interfaced equipment (such as automatically generated commands from inverters 222 (FIG. 2)). To ensure security, access to the local user interface of substation RTU 210 and/or the supervisory system 202 is secured and password protected. Firmware and software upgrades for the control system are preferably capable of execution either locally through substation RTU 210 or remotely through supervisory system 202.

Master controller 213 is configured to provide instructions to plant devices over communications network 560 using non-proprietary communication schemes, such as DNP3, IEC61850, or other common protocols known in the art. Configuring master controller 213 to communicate using non-proprietary communication schemes minimizes latency by utilizing commercially available hardware that is designed for high speed protection schemes to monitor the transmission interconnect between components of plant 100. For example, the described configuration allows for coupling of plant devices manufactured by a first OEM to other plant devices manufactured by a different OEM in a direct fashion, thus providing fast and reliable plant level control. Alternatively, as discussed above with regard to FIG. 2, each power generation site 103 may include a logic element (such as logic element 461 within monitoring and communication device 450) that serves as an intermediary for communicating and translating instructions in different protocols for different plant devices.

Figure 4:
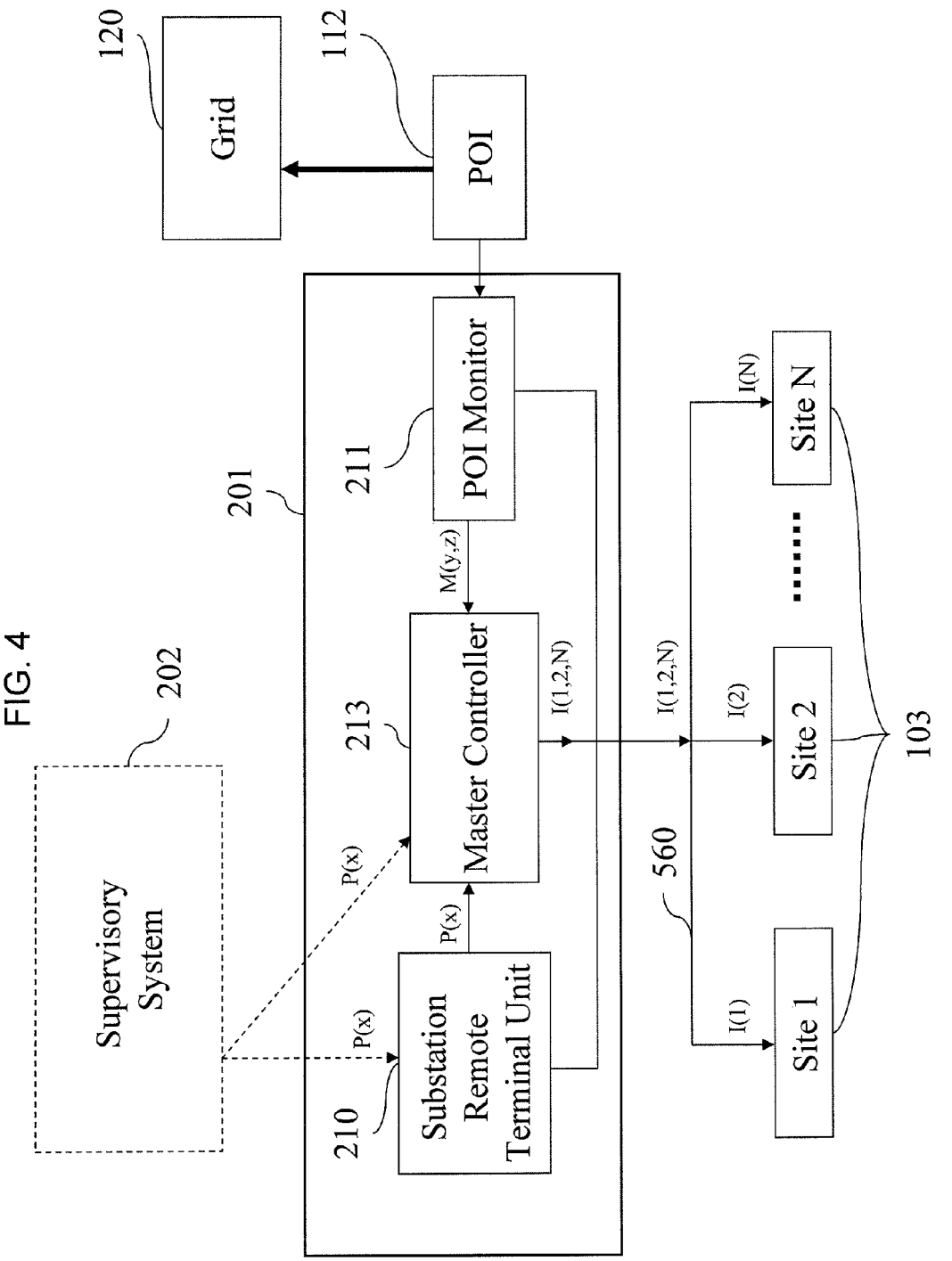
FIG. 4 is a block diagram showing one manner in which a plant-level control function may be provided using the plant-level control system described herein.

FIG. 4 is a block diagram showing one manner in which plant-level control system 201 can be used to issue commands for plant control functions to control plant devices within each power generation site 103. It should be understood that the described process can be applied to various plant control functions described below, as well as to numerous other plant control functions known in the art.

As shown in FIG. 4, a user (e.g., a grid operator) may provide a command P(x)—such as instructions and/or parameters for plant control functions—to master controller 213 through substation remote terminal unit ("RTU") 210. The user may provide the command P(x) through substation RTU 210, or through supervisory system 202. Alternatively, supervisory system 202 may provide the command P(x) directly to master controller 213. If the command P(x) originates in supervisory system 202, it is sent to master controller 213 over communications network 560.

Command P(x) may be an instruction to activate or deactivate one or more power control functions and/or a parameter for power control functions, such as a power set point, a desired voltage for the point of intersection ("POI"), or other values used for power control functions.

Master controller 213 also receives real time measurements M(y,z) of power characteristics and/or other conditions at POI 112 from POI monitoring device 211. If the measurements M(y,z) at POI 112 deviate from those specified by command P(x), master controller 213 is configured to determine the appropriate action (e.g., if power should be increased or decreased), make any calculations that may be needed (e.g., calculating set point values for the increase or decrease), and generate instructions I(1,2,N) for this action. Master controller 213 then provides the generated instructions I(1,2,N) to one or more of power generation sites 103 over communications network 560.

Master controller 213 can be configured to make determinations and generate instructions I(1,2,N) according to control algorithms that are input to master controller 213 through substation RTU 210 or supervisory system 202. Instructions I(1,2,N) may include individualized instructions for each power generation site 103, or individualized instructions for multiple plant devices within each power generation site 103. Alternatively, instructions I(1,2,N) may be identical and commonly sent to all power generation sites 103.

Each power generation site 103 that receives instructions (or a component thereof) from master controller 213 may then provide the appropriate instructions to associated plant devices. For example, as described above with regard to FIG. 2, power generation site 103 may include a monitor and communication device 450 equipped with a programmable logic element 461 for interpreting instructions received over communications network 560. Monitor and communication device 450 may then pass the received instruction (or component thereof) to one or more associated inverters 222 (FIG. 2) or other plant devices at the respective power generation site 103. Alternatively, power generation site 103 may not include a monitor and communication device 450, and the instructions may be received directly by inverters 222 or other plant devices at power generation site 103 through communications network 560.

In response to the respective instructions, integrated controls within the plant devices may adjust the plant device output in order to alter the overall output of the power generation site 103. For example, an inverter 222 (FIG. 2) may be configured to adjust an electrical power output level or voltage level according to the received instructions. Alternatively, inverters 222 may include integrated circuitry that is configured to generate and transmit appropriate instructions to one or more connected plant devices in the DC region of power generation site 103, such as combiner boxes 223, mounting mechanisms 224, and/or PV panels 225 (FIG. 2), to adjust their respective properties, and therein adjust the output of inverters 222 within the power generation site 103.

Examples of control functions that may be provided by the plant-level control system 201 include set-point control of the power output at POI 112, set-point control of the DC current input to one or more inverters 222, ramp-up and ramp-down control of the power output at POI 112, voltage regulation of the voltage at POI 112, power factor regulation of the power factor at POI 112, and frequency response control of the frequency at POI 112, to name but a few. These functions are described further below.

In set point control, plant-level control system 201 regulates the maximum active power output of plant 100, as measured at the POI 112. Plant-level control system 201 activates set-point control according to an active power instruction from a user, for example, through substation RTU 210 or supervisory system 202 via supervisory user interface 230 (FIG. 5). The user similarly may provide a set point parameter. When set point control is activated, plant-level control system 201 will regulate the maximum active power that plant 100 produces at POI 112 based on the provided set point parameter.

When set point control is activated, if the set point parameter is higher than the measured power output of POI 112, set point control will have no effect on the power generation sites 103. If the set point parameter is lower than the measured power output of the POI 112, master controller 213 generates instructions to reduce the output of plant 100 to be within the specified limit, for example by reducing the corresponding output from plant devices at one or more of power generation sites 103. For example, master controller 213 may generate instructions to instruct inverters 222 (FIG. 2) within one or more power generation sites 103 to reduce the inverters' 222 respective overall AC power outputs. Alternatively, master controller 213 may generate instructions to one or more DC plant devices (e.g., combiner boxes 223 or mounting mechanisms 224 for PV panels 225) to reduce the DC plant devices' output (such as through triggering relays in the combiner boxes 223 or reconfiguring mounting mechanisms 224 to redirect the PV panels 225). Plant-level control system 201 continues to monitor the measured power output of POI 112 in real time through POI monitoring device 211. If additional adjustments are needed to reduce the power output of POI 112 in response to the set point parameter, master controller 213 provides additional instructions to power generation sites 103.

DC current input regulation for one or more individual inverters 222 (FIG. 2) prevents damage from the inverters 222 receiving excess loads of DC power, such as from one or more combiner boxes 223. Plant-level control system can be configured to regulate DC current input for all inverters 222 within plant 100, either uniformly or according to inverter-specific parameters, or can be configured to regulate DC current input for only select inverters 222.

Plant-level control system 201 activates DC current input regulation for one or more inverters 222 according to an active power instruction from a user, for example, through substation RTU 210 or supervisory system 202 via supervisory user interface 230 (FIG. 5). Alternatively, plant-level control system 201 can be configured to activate DC current input regulation based on a command that is automatically-generated by the inverter 222. Similarly, a threshold DC current input parameter may be provided by the user, or may be provided automatically by inverter 222.

When DC current input regulation is activated, if the threshold DC current input parameter is higher than the measured DC current that is being input to the regulated inverter 222, the regulation will have no effect on the power generation sites 103. If the threshold DC current input parameter is lower than the measured DC current that is being input to the regulated inverter 222, master controller 213 generates instructions to reduce the output of one or more DC plant devices associated with the regulated inverter 222. For example, master controller 213 may generate instructions to be provided to a combiner box 223 associated with the inverter 222, in order to trigger one or more controlled relays within the combiner box 223 that will stop the combiner box from receiving and outputting DC current from one or more associated PV panels 225, or one or more strings 226 of PV panels 225. The instructions from master controller 213 may be provided to the associated combiner box 223 directly over plant network 560, through monitoring and communication device 450, and/or through inverter 222.

Alternatively, master controller 213 can be configured to generate instructions to be provided to mounting mechanisms 224 (e.g., trackers) that control the configuration of one or more PV panels 225 associated with the regulated inverter 222, in order to adjust the configuration of the PV panels 225 and reduce the overall DC power that is being generated. For example, the mounting mechanisms 224 could be controlled to redirect PV panels 225 so that less light is radiant on the PV panels 225, causing the PV panels 225 to generate a lower DC power output. The instructions from master controller 213 may be provided to the mounting mechanisms 224 directly over plant network 560, through monitoring and communication device 450, and/or through inverter 222.

Plant-level control system 201 continues to monitor the measured DC input current of the regulated inverter 222 in real time through monitoring and communication device 450. If additional adjustments are needed to reduce the DC current input of the regulated inverter 222 in response to the threshold DC current input parameter, master controller 213 provides additional instructions.

Ramp-up and ramp-down control ensure that the output of plant 100 (FIG. 1) does not increase or decrease, respectively, faster than specified by ramp-up and ramp-down rate parameters. Instructions to activate ramp-up control, ramp-down control, or both, and the ramp-up and ramp-down rate parameters, are entered by a user through substation RTU 210 or supervisory system 202 via supervisory user interface 230 (FIG. 5) and provided to master controller 213. The plant output is measured at the POI 112 by POI monitoring device 211, and these measurements are provided to master controller 213. Master controller 213 is configured to determine the change between present measurements at POI 112 and previous measurements at POI 112.

If ramp-up control is activated, master controller 213 determines whether the electrical power at POI 112 is increasing at a greater rate than that specified by the ramp-up rate parameter (for example, due to large variations in the level of incident sunlight on PV panels 225 in FIG. 2). If the power at POI 112 is increasing at a rate that is less than or equal to the rate specified by the ramp-up rate parameter, ramp-up control has no effect on plant 100 (FIG. 1). If the power at POI 112 is increasing at a greater rate than specified by the ramp-up rate parameter, master controller 213 generates instructions to reduce the output of plant 100 to correspond with the ramp-up rate specified by the ramp-up rate parameter, for example by reducing the corresponding output from one or more power generation sites 103.

Similarly, if ramp-down control is activated, master controller 213 determines whether the electrical power at POI 112 is decreasing at a greater rate than that specified by the ramp-down rate parameter. If the power at POI 112 is decreasing at a rate that is less than or equal to the rate specified by the ramp-down rate parameter, ramp-down control has no effect on the operation of plant 100. If the power at POI 112 is decreasing at a greater rate than specified by the ramp-down rate parameter, master controller 213 generates instructions to increase the output of plant 100 to correspond with the ramp-down rate specified by the ramp-down rate parameter, for example by increasing the corresponding output from one or more power generation sites 103. Because present environmental conditions (e.g., cloud cover for PV power plants) can greatly reduce the capability of multiple PV panels 225 (FIG. 2) to generate electricity, and thus greatly affect the overall power available from plant 100, plant-level control system 201 may be configured to utilize techniques such as auxiliary power storage or other known methods to ensure that when ramp-down control is activated, the overall output does not decrease faster than the specified ramp-down parameter. Such techniques may be controlled by substation RTU 210 or supervisory system 202 via supervisory user interface 230.

Voltage regulation controls the plant voltage at the POI 112 to a specified level. For example, when voltage regulation is activated, a desired POI voltage parameter may be entered by a user through substation RTU 210 or supervisory system 202 via supervisory user interface 230 (FIG. 5). POI monitoring device 211 determines the voltage at the POI 112, and provides this voltage to master controller 213. Master controller 213 then determines appropriate voltage or voltage-ampere reactive ("VAR") set points based on the desired POI voltage parameter. VAR is a value typically used to measure reactive power in an AC electrical power system. Master controller 213 sends instructions including the set points to the plant devices in order to achieve closed loop voltage feedback control. It should be understood that the set points may be uniform set points for each power generation site 103, or may be individualized for each power generation site 103 or for plant devices in each power generation site 103.

Power generation sites 103 receive the set points and adjust their respective reactive power levels accordingly. POI monitoring device 211 continues to provide measurements of the voltage at POI 112 to master controller 213. If the voltage at POI 112 is still determined to deviate from the desired POI voltage parameter, master controller 213 provides additional instructions to plant devices (e.g., inverters 222, combiner boxes 223, or other plant devices involved in power generation) at power generation sites 103. Switched capacitor banks (not shown) may also be activated by master controller 213 to compensate for net inductive losses that may occur at power generation sites 103 as a result of the voltage regulation.

Power factor regulation controls the power factor at the POI 112 according to a specified power factor parameter. The "power factor" of an AC electrical system is the ratio of real power (i.e., the actual power flowing to the load) to apparent power (i.e., current multiplied by voltage). Power factor regulation is provided in a manner similar to voltage regulation. When a user provides an instruction to activate power factor regulation and a power factor parameter (for example, through substation RTU 210 or supervisory system 202 via supervisory user interface 230 (FIG. 5)), POI monitoring device 211 detects the ratio of real power to apparent power at POI 112, and provides this ratio to master controller 213. Master controller 213 is configured to determine whether the measured ratio is within tolerable limits of the power factor parameter provided by the user. If so, power factor regulation has no effect on plant 100. If not, master controller 213 provides appropriate instructions to plant devices (e.g., inverters 222, combiner boxes 223, or other plant devices involved in power generation) at power generation sites 103 to achieve power factor regulation.

Plant-level control system 201 may also provide for frequency regulation of plant 100, including regulation of frequency power droop at POI 112. For example, plant-level control system 201 may activate down-power regulation in one or more inverters 222 to compensate when the output frequency at POI 112 is determined to be higher than nominal. Similarly, plant-level control system 201 may activate up-power regulation in one or more inverters 222 to compensate when output frequency at POI 112 is lower than nominal. Instructions to activate frequency regulation, or parameters to define when frequency regulation should be automatically activated, may be provided by a user, for example, through substation RTU 210 or supervisory system 202 via supervisory user interface 230 (FIG. 5).

While plant-level control system 201 may also be configured to provide low voltage and high voltage "ride-through" capability (using parameters and/or commands provided through substation RTU 210 or supervisory system 202 via supervisory user interface 230 (FIG. 5)), these capabilities are preferably provided by the individual plant devices themselves. Low voltage ride-through ("LVRT") refers to a plant's ability to remain on line and "ride through" a low voltage condition at one of the inverters, which may be caused, for example, by an inadvertent grounding of the system or by a sudden connection of a large load. Similarly, high voltage ride-through ("HVRT") refers to the plant's ability to handle high voltage conditions at one of the inverters. Both LVRT and HVRT capability require very fast response from the plant. Accordingly, this capability is preferably provided at an individual plant device, such as through circuitry integrated in each inverter 222 (FIG. 2), rather than by plant-level control system 201.

It should be understood that plant-level control system 201 provides other plant control functions in similar manner to those described above. Provided plant control functions may include controlled startup/shutdown of plant 100, static capacitor/reactor coordination, implementation of a system protection scheme to counteract undesirable conditions that may cause serious stress to plant 100, or other control functions for power plants and other electrical generating systems that are known in the art.

FIG. 5 shows a block diagram of supervisory system 202. Supervisory system 202 provides real time monitoring, alarm processing, historical data archiving, and supervisory control of plant 100, among other functions. As discussed above, elements of supervisory system 202 can be implemented within operations and maintenance station 102 of plant 100 (FIG. 1), or separately from operations and maintenance station 102. Supervisory system 202 includes hardware and software sufficient to enable fully automatic supervisory control and data acquisition for plant 100, as described further below.

Supervisory system 202 is connected to plant-level control system 201 (FIG. 3) at least through communications network 560. In addition, and as described further below, supervisory system 202 is also accessible remotely, such as through network operations center 105 and/or a remote center 106 (which may serve as an offsite customer control center) of plant 100 (FIG. 1).

Supervisory system 202 includes supervisory user interface 230. Supervisory user interface 230 is a self-contained web-based user interface that can be used by onsite personnel (for example, at substation RTU 210 or at operations and maintenance station 102 in FIG. 1), as well as at offsite customer control personnel (such as at remote center 106) and oversight personnel (such as at network operations center 105) through a remote connection (discussed further below). Supervisory user interface 230 provides for monitoring, both locally and remotely, elements of plant 100 (FIG. 1), including key operation and performance indicators of the plant 100, status and operating conditions of individual components (including individual plant devices), system operation (e.g., starting and stopping of inverters 222 (FIG. 2)), and troubleshooting and diagnostic capabilities for the overall system and for individual components. Supervisory user interface 230 also provides for management of all alarms generated by components of plant 100.

Supervisory user interface 230 also provides web-based operational control of aspects of the plant-level control system 201 (FIG. 3). For example, supervisory user interface 230 may be configured to receive external commands and thus provide remote operational control of plant-level control functions executed by master controller 213 (FIG. 3) through communications network 560. Supervisory user interface 230 also provides for configuration of master controller 213 through communications network 560. Additionally, supervisory user interface 230 provides for operation of master controller 213 and/or individual plant devices through communications network 560, such as control and/or start-up and shutdown sequencing of individual inverters 222 (FIG. 2).

Supervisory user interface 230 provides authorized users both local and/or remote access to a graphical user interface through a web browser client. Supervisory user interface 230 provides the user with the ability to monitor key components of plant 100 (FIG. 1), including plant output at POI 112, output and status of each power generation site 103, connectivity of communications network 560, and the status and output of individual plant devices (such as inverters 222, combiner boxes 223, mounting mechanisms 224, PV panels 225, and sensors 452 (FIG. 2)).

Supervisory user interface 230 may be the primary device for communicating with and providing commands to plant-level control system 201, and is preferably capable of providing a complete visualization of the present capability of plant 100 (FIG. 1), such as voltage, power factor, and power level of plant 100 as measured at POI 112. Supervisory user interface 230 is also preferably configured to set plant-level control system 201 into different operating modes, including normal operational start up, shut down, in-service and out-of-service, as well as be able to adjust parameters for plant level control functions.

Supervisory user interface 230 is also configured to provide access to historical data saved on historical data server 232 (described further below), and reports generated from this historical data, locally at substation 101 (FIG. 1) or operations and maintenance station 102, and remotely (such as at network operations center 105 or remote center 106). In addition, supervisory user interface 230 can provide real time or historical access, either locally or remotely, to one or more key performance indicators of plant 100, such as overall electrical power output and availability.

Supervisory system 202 also includes a real time data server 231. Real time data server 231 is configured to aggregate real time data, such as operational and other data, from several or all plant devices within plant 100 (FIG. 1) over communications network 560. Data stored on real time data server 231 is accessible to a user through supervisory user interface 230. Real time data server 231 communicates to each of the plant devices through communications network 560, and updates the data at a regular interval (e.g., once every second). Real time data server may also aggregate real time data from POI monitoring device 211 and/or master controller 213 (FIG. 3) through communications network 560.

Plant devices that provide data to real time data server 231 preferably include one or more storage elements, such as a direct-attached storage ("DAS") element. As discussed above with regard to FIG. 2, monitoring and control element 450 in each power generation site 103 may include a storage element 460 to store data from plant devices within the power generation site 103. Alternatively, individual plant devices (such as in PV panels 225, inverters 222, sensors 452, etc.) may include their own storage elements.

Real time data server 231 is configured to process and provide monitoring of different types and quantity of data. For example, real time data server 231 may also be configured to process alarm signals received over communications network 560, and provide these alarm signals to alarm manager 235 (described further below).

Supervisory system 202 also includes a historical data server 232. Historical data server 232 may be a Structured Query Language ("SQL") server or similar server that is configured to capture and store all operational data from plant 100 (FIG. 1). Historical data server 232 can also be configured to store different types and quantity of data, such as various alarms and status messages from plant 100 or plant devices.

Historical data server 232 runs data collection routines to accumulate data from the real time data server 231 and store the data, at a configurable frequency, into historical data server 232 in a manner accessible for later use, such as in a SQL format. These data collection routines may be defined and modified using the supervisory user interface 230. The data collection routines may also be configured to derive statistics (such as the average power output by plant 100 over specified intervals). These statistics may be retained on historical data server 232, and the corresponding real-time data from real time server 231 may be compressed or deleted after the desired statistics are derived, rather than stored on historical data server 232. Preferably, the data collection routines are regularly performed during a time period where plant activity is at a minimum and thus the server processing load is minimal, such as overnight for a solar power plant.

As shown in FIG. 5, supervisory system 202 also includes functional elements such as a reporting system 233 including a report processing element 234, an alarm manager 235, a remote access security element 236 providing access to a router or modem 250, a data transfer interface 237, an external systems data server 238, a mobile interface 239, and a tracker system monitoring element 240. These functional elements may be provided via one or more processors in user interface 230 or elsewhere in supervisory system 202 (for example, in operations and maintenance station 102 (FIG. 1)).

Reporting system 233 is a web-based system for providing a report generated by data collected by the data collection routines from real time data server 231 and/or historical data server 232. Reporting system 233 includes a report processing element 234, which may be a processor system configured to generate a standard report or to accept user specifications in order to configure the reports to the user's specific needs. For example, if historical data server 232 is a SQL server, third party software tools that are known in the art and widely available may be used to configure the report processing element 234 to generate reports specifically configured to the user's needs.

Alarm manager 235 collects instances of alarms, warnings, and/or diagnostics messages from various plant devices directly through communications network 560 or through real time data server 231, or both. Alarm manager 235 provides these messages to both local and remote users of supervisory system 202 (for example, through supervisory user interface 230) in order to aid troubleshooting and performing of diagnostics. Alarm manager 235 can be configured to classify each alarm into pre-specified configurable priority categories. For example, some alarms can be classified as requiring user acknowledgment. As another example, some alarms can be configured to trigger additional actions, such as remote notification through e-mail or automatic dial-out.

Remote access security element 236 provides remote users, such as users at network operations center 105 or remote center 106, secure access to supervisory system 202 and/or supervisory user interface 230 through a network router or modem connection 250. Remote access security element 236 includes firewall capability, and provides proxy and/or authentication services for users outside of plant 100 who wish to access to the communications network 560. Remote access security element 236 may also be configured to maintain an audit trail of authenticated users, their activity while accessing supervisory system 202, and unsuccessful attempts to access supervisory system 202.

Data transfer interface 237 provides for transfer of a subset of data from the historical data server 232 to a remote database or system, such as to the network operations center 105 or remote center 106 (FIG. 1). Data transfer interface 237 preferably includes capability for configuring and defining the desired subset of data for transfer, and for specifying the time interval for such a transfer. For example, data transfer interface 237 may be configured to automatically create a file of data in a predefined format on a periodic basis, which can be transferred to other centralized locations for further processing. Data transfer interface 237 may also be configured to provide data from real time data server 231 to the supervisory database or system.

External systems data server 238 may be a server configured as an object linking and embedding for process control ("OPC") server. OPC is an industry standard for the communication of real time plant data between control devices from different manufacturers. Accordingly, external systems data server 238 allows external systems to access certain plant data, as permitted by supervisory system 202.

Mobile interface 239 provides access to certain plant data through a mobile device. For example, a user may be permitted, via mobile interface 239, to view key performance indicators and/or alarms through supervisory user interface 230 on a mobile device. Mobile interface 239 is preferably configured such that it does not provide full plant control or supervisory control functions. In addition, mobile interface 239 preferably includes appropriate security in order to ensure that only authorized users have access to the plant data.

Tracker monitoring element 240 collects and makes available information related to the configuration of the mounting mechanisms 224 (FIG. 2) at power generation sites 103. As discussed above with regard to FIG. 2, mounting mechanisms 224, such as trackers, are used to orient PV panel cells at power generation sites. Tracker monitoring element 240 provides a user of the supervisory user interface 230 access to orientation data and diagnostics for individual mounting mechanisms 224, which may be collected by real time data server 231 across communications network 560.

The above description and drawings are only to be considered illustrative of specific embodiments, which achieve the features and advantages described herein. Modification and substitutions to specific processes, architectures, systems, and structures can be made. For example, it should be understood that appropriate components and configurations other than those specifically described in connection with the above embodiments may be used, and that the steps of the processes described above may be performed in a different order than the specific order in which they are described. The described concepts are easily applied to additional types of plant devices, plant control functions, power plants, and electrical generating systems known in the art. Accordingly, the embodiments of the invention are not to be considered as being limited by the foregoing description and drawings, but only by the scope of the appended claims.

What is claimed as new and desired to be protected by Letters Patent of the United States is:

1. A control system for a photovoltaic ("PV") power plant, said PV power plant including a plurality of power generation sites containing plant devices used to provide electrical power to an electrical grid, said control system comprising:
   a plant-level control system for controlling plant control functions of said PV power plant by providing instructions to said plurality of power generation sites;
   a supervisory system configured to perform monitoring and data acquisition functions related to said plant devices and to provide commands for plant control functions to said plant-level control system;
   a communications network providing communications among said plant devices, said plant-level control system, and said supervisory system; and
   a monitoring and communication device at a respective one of said power generation sites and interfaced with said plant devices at said power generation site, wherein said monitoring and communication device is configured to:
   collect measured direct-current ("DC") power characteristics of plant devices and interconnections in a DC region of said respective power generation site, the DC region being between and including the plant devices and an input to a DC to AC inverter; and
   collect measured alternating-current ("AC") power characteristics of plant devices and interconnections in an AC region of said respective power generation site, the AC region being between and including an output of a DC to AC inverter and an input to the electrical grid.

2. The control system of claim 1, wherein said PV power plant further comprises a point of intersection for receiving electrical power generated from said plurality of power generation sites and providing said electrical power to said electrical grid.

3. The control system of claim 2, wherein:
   said DC a direct-current ("DC") region comprises comprising:
      a plurality of PV panels for generating a DC electrical signal from radiant light; and
      at least one combiner box configured to receive and combine said DC electrical signals generated by said plurality of PV panels; and
   said AC an alternating-current ("AC") region comprises comprising:
      at least one inverter configured to receive said combined DC electrical signal from said at least one combiner box, wherein said at least one inverter inverts said combined DC electrical signal to an AC signal and provides said AC signal to said point of intersection of said PV power plant.

4. The control system of claim 3, wherein said at least one combiner box of each of said power generation sites includes a plurality of combiner boxes each receiving a DC electrical signal from a plurality of associated PV panels, and wherein said at least one inverter is configured to receive combined DC electrical signals from said plurality of combiner boxes, each of said plurality of combiner boxes further comprising:
   a relay switch configured to stop said combiner box from receiving DC power from at least one of said associated PV panels.

5. The control system of claim 4, wherein each of said plurality of combiner boxes is configured to trigger said relay switch according to instructions received from said at least one inverter.

6. The control system of claim 5, wherein said at least one inverter is configured to instruct at least one of said plurality of associated combiner boxes to trigger said respective relay switch when a total amount of DC current received by said inverter exceeds a threshold.

7. The control system of claim 4, wherein each of said plurality of combiner boxes is configured to trigger said relay switch according to instructions received from said plant-level control system.

8. The control system of claim 2, said plant-level control system further comprising:
   at least one device for monitoring power characteristics at said point of intersection; and
   a master controller configured to:
      receive said power characteristics from said at least one monitoring device;
      generate said instructions for said plant control functions according to said received power characteristics; and
      provide said instructions to said one or more plant devices through said communications network.

9. The control system of claim 1, wherein said supervisory system comprises a supervisory user interface for providing commands for said plant control functions to said plant-level control system.

10. The control system of claim 9, wherein said supervisory system further comprises:
- a first data server configured to aggregate real time data from said plant devices; and
- a second data server configured to accumulate historical data from said first data server according to at least one data collection routine,
- wherein said user interface for providing said supervisory control instructions is configured to access said first data server and said second data server.

11. A photovoltaic ("PV") power plant comprising:
- a plurality of power generation sites, each of said plurality of power generation sites comprising:
  - a direct current ("DC") region comprising:
    - a plurality of PV panels for generating DC electrical signals; and
    - at least one combiner box configured to receive and combine said DC electrical signals from associated PV panels of said plurality of PV panels; and
  - an alternating current ("AC") region comprising:
    - at least one inverter configured to receive said combined DC electrical signal from said at least one combiner box and invert said combined DC electrical signal to an AC electrical signal; and
    - an output site for outputting said AC electrical signal;
- a point of intersection for receiving electrical said AC electrical signal from said plurality of power generation sites and providing said AC electrical signal to an electrical power grid; and
- a control system for providing control functions and supervisory functions for said PV power plant, said control system comprising:
  - a plant-level control system for controlling plant control functions of said PV power plant by providing instructions to said plant devices at said plurality of power generation sites;
  - a supervisory system configured to perform monitoring and data acquisition functions for said plant devices at said plurality of power generation sites and to provide commands for plant control functions to said plant-level control system; and
  - a communications network providing communications among said plant devices, said plant-level control system, and said supervisory system; and
  - a monitoring and communication device at a respective one of said power generation sites and interfaced with said plant devices at said power generation site, wherein said monitoring and communication device is configured to:
    - collect measured DC power characteristics of plant devices and interconnections in said DC region of said respective power generation site, the DC region being between and including the plant devices and an input to a DC to AC inverter; and
    - collect measured AC power characteristics of plant devices and interconnections in said AC region of said respective power generation site, the AC region being between and including an output of a DC to AC inverter and an input to the electrical grid.

12. The PV power plant of claim 11, said at least one combiner box further comprising a relay switch for stopping the receipt of DC power from at least one of said associated PV panels according to said detected DC power characteristics.

13. The PV power plant of claim 11, said plant-level control system further comprising:
- at least one device for monitoring power characteristics at said point of intersection; and
- a master controller configured to:
  - receive said power characteristics from said at least one monitoring device;
  - generate said instructions for said plant devices according to said received power characteristics; and
  - provide said instructions to said plant devices through said communications network.

* * * * *